US008217418B1

(12) United States Patent
Pan et al.

(10) Patent No.: US 8,217,418 B1
(45) Date of Patent: Jul. 10, 2012

(54) SEMI-POLAR SEMICONDUCTOR LIGHT EMISSION DEVICES

(75) Inventors: Shaoher X. Pan, San Jose, CA (US); Jay Chen, Saratoga, CA (US); Justin Payne, San Jose, CA (US); Michael Heuken, Aachen (DE)

(73) Assignee: SiPhoton Inc., San Jose, CA (US)

( * ) Notice: Subject to any disclaimer, the term of this patent is extended or adjusted under 35 U.S.C. 154(b) by 0 days.

(21) Appl. No.: 13/026,698

(22) Filed: Feb. 14, 2011

(51) Int. Cl.
*H01L 33/00* (2010.01)

(52) U.S. Cl. .............. 257/103; 257/79; 257/80; 257/98; 257/E33.003

(58) Field of Classification Search .................. 257/103, 257/79, 80, 98
See application file for complete search history.

(56) References Cited

U.S. PATENT DOCUMENTS

| | | | |
|---|---|---|---|
| 5,793,062 A | 8/1998 | Kish, Jr. et al. | |
| 5,838,029 A | 11/1998 | Shakuda | |
| 5,905,275 A | 5/1999 | Nunoue et al. | |
| 6,233,265 B1 | 5/2001 | Bour et al. | |
| 6,345,063 B1 | 2/2002 | Bour et al. | |
| 6,426,512 B1 | 7/2002 | Ito et al. | |
| 6,635,901 B2 | 10/2003 | Sawaki et al. | |
| 6,844,569 B1 | 1/2005 | Lee et al. | |
| 6,881,981 B2 | 4/2005 | Tsuda et al. | |
| 6,936,851 B2 | 8/2005 | Wang | |
| 6,949,395 B2 | 9/2005 | Yoo | |
| 7,176,480 B2 | 2/2007 | Ohtsuka et al. | |
| 7,453,093 B2 | 11/2008 | Kim et al. | |
| 7,550,775 B2 | 6/2009 | Okuyama | |
| 7,956,370 B2 | 6/2011 | Pan | |
| 7,968,356 B2 | 6/2011 | Kim | |
| 8,129,205 B2 * | 3/2012 | Rana et al. | 438/26 |
| 2004/0113166 A1 | 6/2004 | Tadatomo et al. | |
| 2005/0179025 A1 | 8/2005 | Okuyama et al. | |
| 2005/0199891 A1 | 9/2005 | Kunisato et al. | |
| 2006/0169987 A1 | 8/2006 | Miura et al. | |
| 2007/0200135 A1 | 8/2007 | Wang | |
| 2008/0032439 A1 | 2/2008 | Lee et al. | |
| 2008/0179611 A1 | 7/2008 | Chitnis et al. | |
| 2008/0251808 A1 | 10/2008 | Kususe et al. | |
| 2008/0303042 A1 | 12/2008 | Minato et al. | |

(Continued)

FOREIGN PATENT DOCUMENTS

CN 1638162 A 7/2005

(Continued)

OTHER PUBLICATIONS

Authorized officer Nora Lindner, International Preliminary Report on Patentability in PCT/US2010/035020, mailed Dec. 22, 2011, 10 pages.

U.S. Appl. No. 13/286,108, filed Oct. 31, 2011, Light Emitting Device, Pan.

(Continued)

*Primary Examiner* — Marcos D. Pizarro
*Assistant Examiner* — Eva Yan Montalvo
(74) *Attorney, Agent, or Firm* — Fish & Richardson P.C.

(57) ABSTRACT

A light emitting device includes a silicon substrate comprising a (111) surface and a GaN crystal structure over the (111) surface of the silicon substrate. The GaN crystal structure includes a first surface along a semi-polar plane of the GaN crystal structure and a second surface along a polar plane of the GaN crystal structure. The light emitting device also includes light emission layers over the first surface of the GaN crystal structure. The light emission layers include at least one quantum well comprising GaN.

18 Claims, 10 Drawing Sheets

U.S. PATENT DOCUMENTS

| | | | | |
|---|---|---|---|---|
| 2008/0308835 | A1* | 12/2008 | Pan | 257/103 |
| 2009/0032799 | A1* | 2/2009 | Pan | 257/13 |
| 2009/0159869 | A1 | 6/2009 | Ponce et al. | |
| 2009/0159870 | A1 | 6/2009 | Lin et al. | |
| 2009/0298212 | A1 | 12/2009 | Pan | |
| 2010/0078670 | A1 | 4/2010 | Kim et al. | |
| 2010/0203662 | A1 | 8/2010 | Pan | |
| 2010/0308300 | A1 | 12/2010 | Pan | |
| 2011/0108800 | A1 | 5/2011 | Pan | |
| 2011/0114917 | A1 | 5/2011 | Pan | |
| 2011/0175055 | A1 | 7/2011 | Pan | |
| 2011/0177636 | A1 | 7/2011 | Pan et al. | |
| 2011/0233581 | A1* | 9/2011 | Sills et al. | 257/98 |
| 2012/0043525 | A1 | 2/2012 | Pan | |

FOREIGN PATENT DOCUMENTS

| | | | |
|---|---|---|---|
| JP | 2006-045648 | A | 2/1994 |
| JP | 2005-328073 | A | 11/2005 |
| KR | 10-2003-0074824 | A | 9/2003 |
| KR | 10-0649769 | B1 | 11/2006 |
| KR | 10-0705226 | B1 | 4/2007 |

OTHER PUBLICATIONS

Authorized officer Julio Maldonado, International Search Report and Written Opinion in PCT/US2011/20603, mailed Dec. 6, 2011, 11 pages.

Authorized officer Jae Hun Park, International Search Report and Written Opinion in PCT/US2008/008868, mailed Apr. 15, 2009, 13 pages.

Authorized officer Young Bae Lee, International Search Report and Written Opinion in PCT/US2008/068067, mailed Feb. 26, 2009, 12 pages.

Authorized officer Young Bae Lee, International Search Report and Written Opinion in PCT/US2010/035020, mailed Dec. 17, 2010, 14 pages.

Authorized officer Simin Baharlou, International Preliminary Report on Patentability in PCT/US2008/068067, mailed Jan. 13, 2011, 7 pages.

Authorized officer Simin Baharlou, International Preliminary Report on Patentability in PCT/US2008/008868, mailed Feb. 3, 2011, 8 pages.

* cited by examiner

SEMI-POLAR SEMICONDUCTOR LIGHT EMISSION DEVICES

BACKGROUND OF THE INVENTION

This patent application is related to solid state light emitting devices.

Solid-state light sources, such as light emitting diodes (LEDs) and laser diodes, can offer significant advantages over incandescent or fluorescent lighting. Solid-state light sources are generally more efficient and produce less heat than traditional incandescent or fluorescent lights. When LEDs or laser diodes are placed in arrays of red, green and blue elements, they can act as a source for white light or as a multi-colored display. Although solid-state lighting offers certain advantages, conventional semiconductor structures and devices used for solid-state lighting are relatively expensive. The high cost of solid-state light emitting devices is partially related to their relatively complex and time-consuming manufacturing process.

Referring to FIG. 1, a prior art LED structure 100 includes a substrate 105, such as sapphire. A buffer layer 110 is formed on the substrate 105. The buffer layer 110 serves primarily as a wetting layer to promote smooth, uniform coverage of the sapphire substrate. The buffer layer 310 is typically deposited as a thin amorphous layer using Metal Organic Chemical Vapor Deposition (MOCVD). An n-doped Group III-V compound layer 120 is formed on the buffer layer 110. The n-doped Group III-V compound layer 120 is typically made of GaN. An InGaN quantum-well layer 130 is formed on the n-doped Group III-V compound layer 120. An active Group III-V compound layer 140 is then formed on the InGaN quantum-well layer 130. A p-doped Group III-V compound layer 150 is formed on the layer 140. A p-electrode 160 (anode) is formed on the p-doped Group III-V compound layer 150. An n-electrode 170 (cathode) is formed on the n-doped Group III-V compound layer 120.

The GaN crystal has different electric properties along different crystal directions. The (0001) crystal planes are perpendicular to the c-axis and have the highest electric polarity compared to other planes. The (1-100) crystal planes are perpendicular to the m-axis and are non-polar. Other GaN crystal planes such as (1-101) are semi-polar and have electric polarity less than that of the (0001) crystal planes.

Different crystal planes of GaN crystal also have different optical properties. The internal quantum efficiency (IQE) is the highest for the non-polar (1-100) crystal planes and lower for the semi-polar crystal planes, such as (0001) plane. The polar (0001) crystal planes have the lowest quantum efficiency. In a light emitting device, it is desirable to produce light emission from the non-polar or semi-polar crystal planes to obtain high emission intensity.

Early GaN LEDs had been formed on sapphire, silicon carbide, or spinel substrates (105 in FIG. 1). Recently, attempts have been made to grow GaN light emitting devices having non-polar emission surfaces on $LiAlO_2$ substrates. Although it was found that the light emission of these LED structures were spectrally stable and polarized, the emission intensities were low due to numerous defects formed in the GaN crystals during growth on the $LiAlO_2$ substrate.

SUMMARY

This patent application discloses light emitting devices that have improved light emission efficiency and light emission intensity compared to conventional GaN LEDs by using semi-polar GaN crystal surfaces as base for quantum wells.

The light emission from the disclosed light emitting devices is also highly polarized, which is very useful for many display applications.

The disclosed devices may have certain advantages, including that they can provide single GaN crystals with very low defect density, which improves device reliability and lifetime; they can be tailored in different form factors to suit different applications; and they can be fabricated on a silicon substrate, which is compatible with many microelectronic devices.

In one general aspect, the present invention relates to a light emitting device that can include a silicon substrate comprising a (111) surface and a GaN crystal structure over the (111) surface, wherein the GaN crystal structure can have a first surface along a semi-polar plane of the GaN crystal structure, and a second surface along a polar plane of the GaN crystal structure. Light emission layers that can have at least one quantum well of GaN lie over the first surface of the GaN crystal structure.

In another general aspect, these light emitting devices can include a silicon substrate having a (100) silicon upper surface with a recess in part defined by (111) silicon surfaces. A GaN crystal structure lies over one of the (111) silicon surfaces, and has a first surface along a semi-polar plane of the GaN crystal structure, and a second surface along a polar plane of the GaN crystal structure. The light emission layers have at least one quantum well comprising GaN lie over the first surface of the GaN crystal structure.

Implementations of the light emitting devices may include one or more of the following. The first surface can form an angle between about 52 degrees and about 72 degrees relative to the m-axis of the GaN crystal structure. The first surface can be substantially parallel to the (1-101) GaN crystal plane. The first surface can intercept the (111) surface of the silicon substrate at an angle between about 52 degree and about 72 degrees. The second surface can be substantially parallel to the (0001) GaN crystal plane and perpendicular to the c-axis of the GaN crystal structure. The first surface and the second surface can intercept each other at an angle between about 108 degrees and about 128 degrees.

The GaN crystal structure can be doped and is configured to perform as a lower electrode layer for the light emission layers. The light emitting device can further include an upper electrode layer on the light emission layers, wherein the light emission layers can emit light when an electric field is applied across the light emission layers between the GaN crystal structure and the upper electrode layer. The GaN crystal structure can be doped with silicon. The light emitting device can further include a reflective layer between the (111) surface of the silicon substrate and the GaN crystal structure. The reflective layer can include silicon doped AlGaN or silicon doped AlN. The light emitting device can further include a buffer layer between the reflective layer and the (111) surface of the silicon substrate. The buffer layer can include silicon doped AlN. The silicon substrate can further include a (100) surface and a recess formed in its (100) upper surface, the recess defined in part by the (111) surface. The recess can have the shape of an elongated trench, an inverse pyramid, or a truncated inverse pyramid. The quantum well can be formed by InGaN and GaN.

BRIEF DESCRIPTION OF THE DRAWINGS

The following drawings, which are incorporated in and form a part of the specification, illustrate embodiments of the present invention and, together with the description, serve to explain the principles of the invention.

DETAILED DESCRIPTION OF THE EMBODIMENTS

Figure 1:
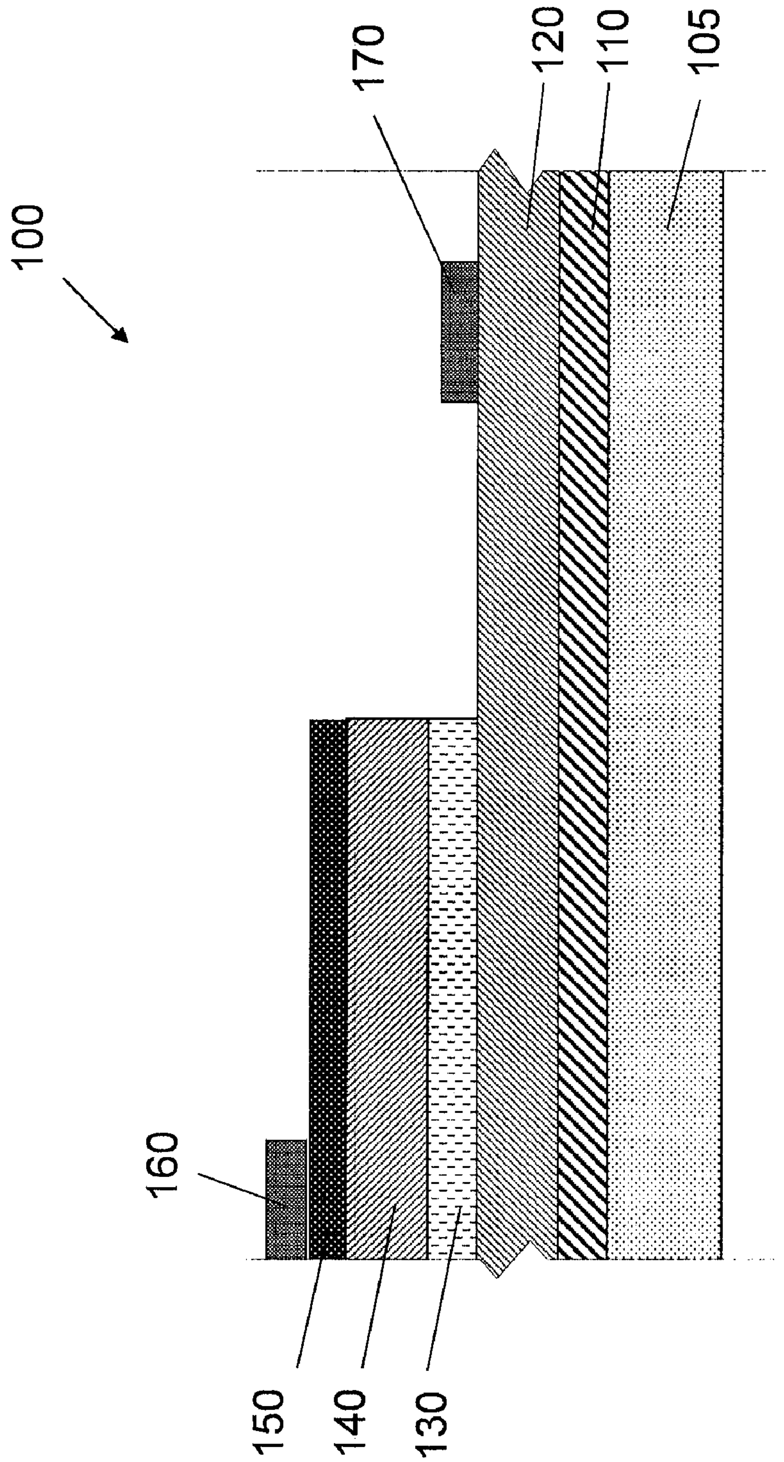
FIG. 1 is a cross-sectional view of a prior art LED structure.
Figure 2:
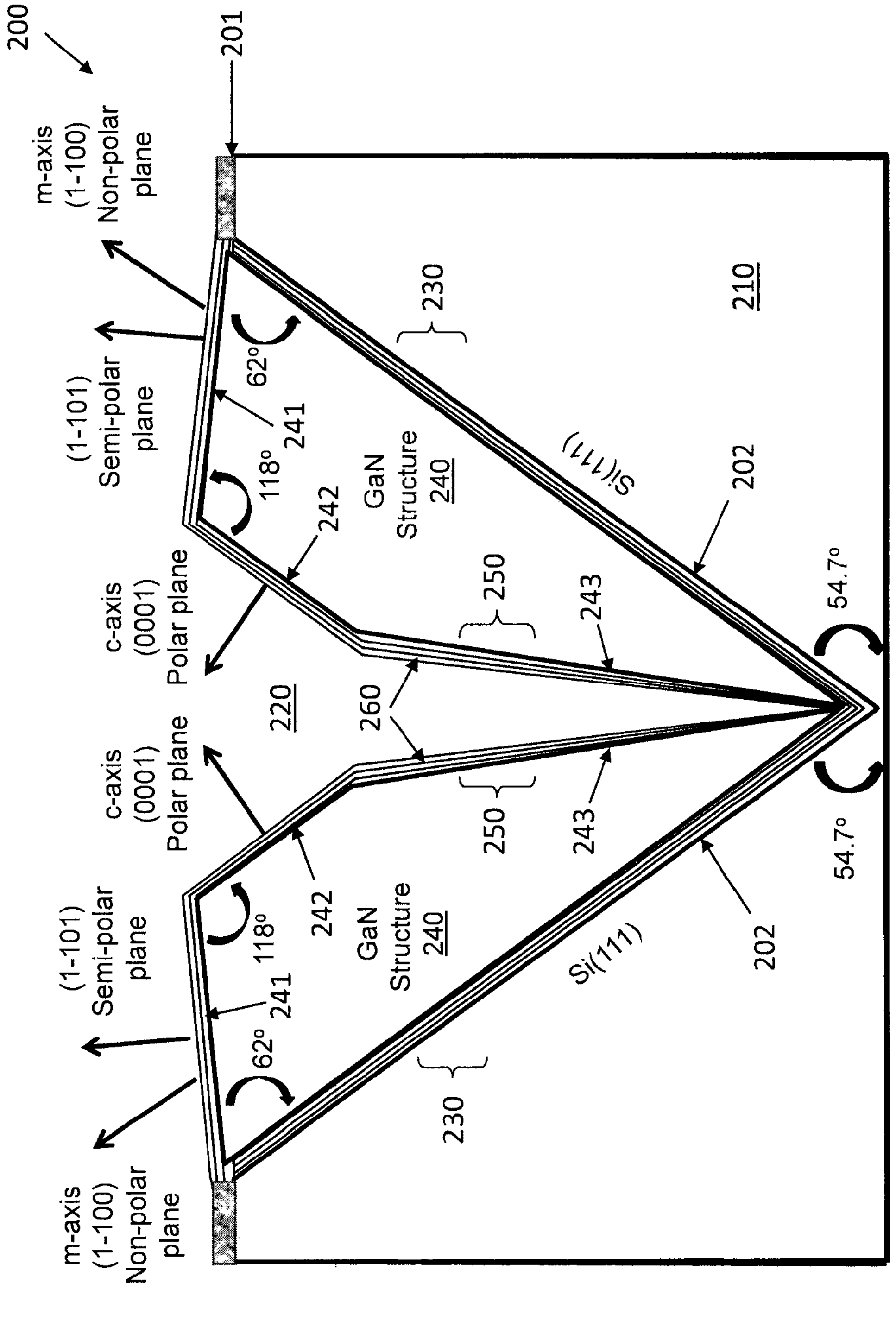
FIG. 2 is a cross-sectional view of a GaN light emitting device in accordance with an embodiment of the present invention.

Referring to FIG. 2, a light emitting device 200 includes a silicon substrate 210 having a (100) upper surface 201, a recess 220 defined at least in part by (111) surfaces 202, buffer and reflective layers 230 on the surfaces 202, a doped GaN crystal structure 240 on the buffer and reflective layers 230, light emission layers comprising quantum well layers 250 on the doped GaN crystal structure 240, and a doped GaN layer 260 on the quantum well layers 250. The doped GaN crystal structure 240 and the doped GaN layer 260 are conductive and can respectively serve as lower and upper electrodes for the quantum well layers 250.

A recess 220 in the light emitting device 200 is formed in the (100) upper surface 201 of the silicon substrate 210. A SiN mask (not shown) formed on the (100) upper surface can have square or rectangle openings. The dimensions of each side of these openings can be in the range from tens of microns to a few millimeters. Etching through openings in the SiN mask results the formation of recess 220 having the (111) surfaces 202. The (111) surfaces 202 are tilted at a 54.7° angle relative to the (100) surfaces (the upper surface 201) of the silicon substrate 210. Additional description of the structure, fabrication method and theory behind the light emission device shown in FIG. 2 are set forth in co-pending U.S. patent application Ser. No. 12/177,114 by S. Pan, filed on Jul. 21, 2008 and entitled, "Light Emission Device," the disclosure of which is incorporated by reference herein.

Figure 3A:
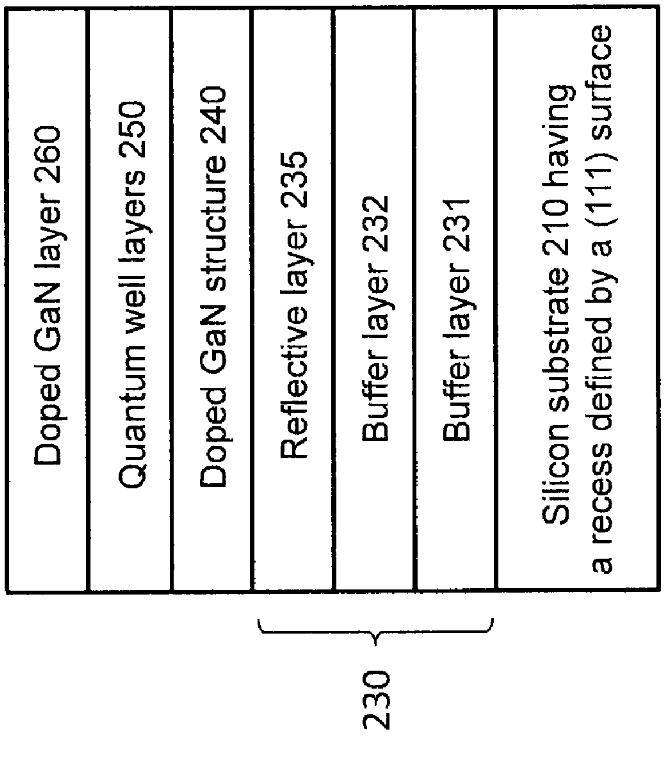
FIG. 3A is a schematic representation of a cross-section of multi-layer structure of the light emitting device shown in FIG. 2.
Figure 3B:
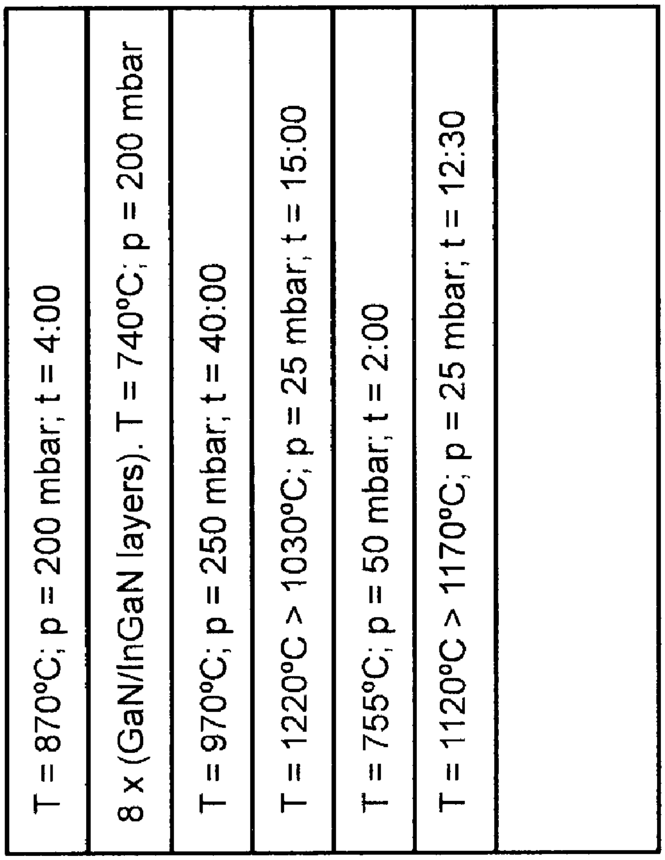
FIG. 3B illustrates material compositions and formation conditions for different layers of the light emitting device shown in FIGS. 2 and 3A.

The buffer and reflective layers 230, shown diagrammatically in FIG. 2, are shown in FIG. 3A. Referring now to FIG. 3A, these layers include a buffer layer 231, a second buffer layer 232, and a reflective layer 235. Referring to FIGS. 3A and 3B, the buffer layer 231, also called a high-temperature buffer layer, comprises silicon doped AlN. The 30 nm thick, high temperature silicon doped AlN buffer layer 231 is deposited on the (111) surface 202 of the substrate 210 (shown in FIG. 2) at a temperature between about 1120° C. and 1170° C., and a pressure of about 25 mbar for about 15 minutes. The second 10 nm thick buffer layer 232, also called the low-temperature buffer layer, also comprises silicon doped AlN. The second buffer layer 232 is deposited on the buffer layer 231 at a lower temperature of about 755° C., at a pressure of about 50 mbar for about 5 minutes. The 400 nm thick reflective layer 235, formed by AlGaN doped with silicon is deposited on the buffer layer 232 at a temperature from about 1220° C. to 1030° C. and at a pressure of about 25 mbar for about 50 minutes.

A layer of doped GaN crystal structure 240 more than 1 um thick is deposited on the reflective layer 235 at about 970° C. and at a pressure of about 250 mbar for more than 1 hour. The doped GaN crystal structure 240 comprises GaN doped by silicon. Referring now both to FIGS. 2 and 3A, during deposition, the doped GaN crystal structure 240 grows along a c-axis (i.e., the (0001) direction), which forms a surface 242 that is substantially parallel to the (0001) crystal plane and perpendicular to the c-axis. The surface 242 is also substantially parallel to the (111) surface 202 of the substrate 210. The surface 242 of the doped GaN crystal structure 240 is an electrically polar surface. The doped GaN crystal structure 240 has an m-axis along the (1-100) direction, which defines electrically non-polar planes. The m-axis or the (1-100) direction is substantially parallel to the (111) surface 202 of the substrate 210.

The doped GaN crystal structure 240 also grows naturally in the (1-101) direction, which defines a surface 241 that is parallel to the (1-101) crystal plane. The surface 241 is at an angle between about 52° and about 72°, or for example, approximately 62°, relative to m-axis of the doped GaN crystal structure 240. The surface 241 is at the same angle relative to the (111) surface 202 of the substrate 210. The (1-100) direction and the (1-101) direction are offset by an approximately that same angle. The surface 241 is semi-polar and has an electric polarity lower than that of the surface 242. The surface 241 and the surface 242 intercept at an angle between about 108° and about 128°, for example, 118°. The doped GaN crystal structure 240 also includes surfaces 243 formed in the deep central portion of the recess 220. The orientations of the surfaces 243 are in part determined by the deposition materials of the quantum well layers 250 used in the deep central region of the recess 220.

The quantum well layers 250 comprise a plurality (for example eight) repetitive, interleaved GaN and InGaN layers, each with a thickness of 20 nm and 3 nm, respectively. The quantum well layers 250 are formed at about 740° C. and at a pressure of about 200 mbar. The buffer layers 231 and 232 (FIG. 3A) can reduce mechanical strain between the (111) silicon surfaces 202 and the doped GaN crystal structure 240 to allow the doped GaN crystal structure 240 to be epitaxially grown on the (111) surfaces 202 of the silicon substrate 210. The buffer layers 231 and 232 can also prevent cracking and delamination in the quantum well layers 250, which improves light emitting efficiency of the light emitting device 200. The 50 nm thick GaN layer 260 (the upper electrode layer), doped for example with Mg, is next deposited on the quantum well layers 250 at 870° C. and at a pressure of 200 mbar for about 10 min.

The buffer layers 231 and 232, the reflective layer 235, and the quantum well layers 250 can be formed using atomic layer deposition (ALD), Metal Organic Chemical Vapor Deposition (MOCVD), Plasma Enhanced Chemical Vapor Deposition (PECVD), Chemical Vapor Deposition (CVD), or Physical vapor deposition (PVD). The doped GaN crystal structure 240 and the doped GaN layer 260 can be deposited by PVD, PECVD, or CVD.

In light emitting operation, an electric voltage is applied across the lower and the upper electrodes that include, respectively, the doped GaN crystal structure 240 and the doped GaN layer 260. The electric current passing through the quantum well layers 250 can cause electrons and holes to recombine, resulting in light emission.

Figure 4A:
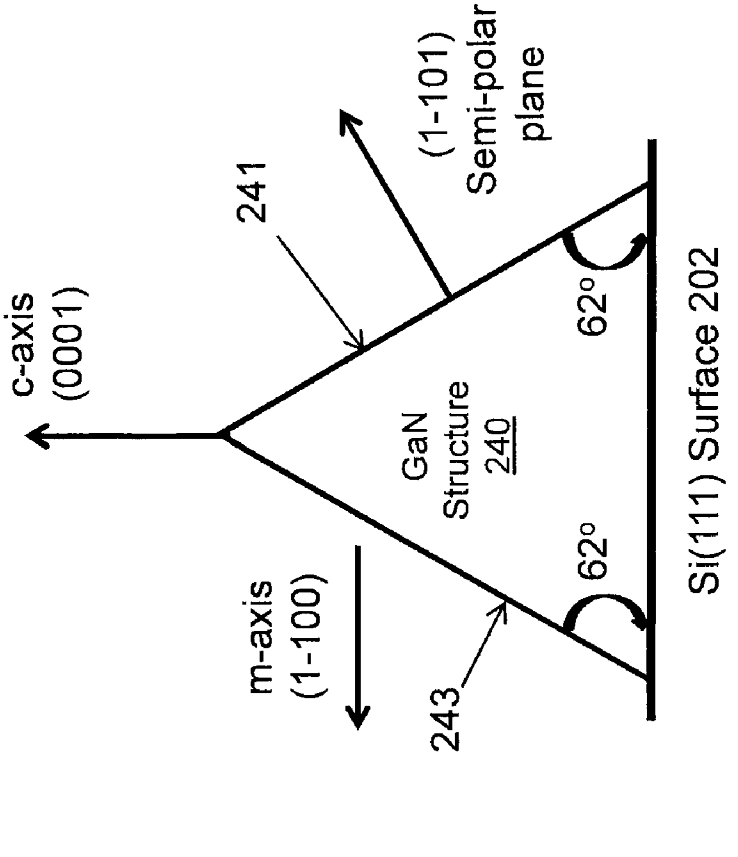
FIGS. 4A and 4B are detailed cross-sectional views illustrating the growth of GaN crystal on the Si(111) surface shown in FIG. 2.
Figure 4B:
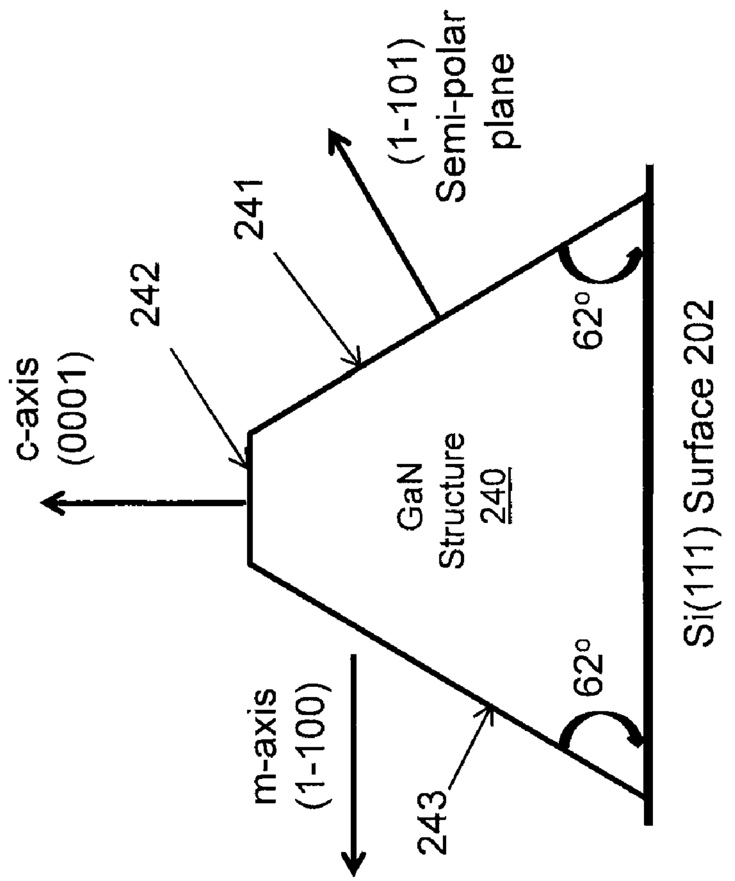

The growth of the doped GaN crystal structure 240 is illustrated in detail in FIGS. 4A and 4B. The GaN crystal structure 240 is initially defined by semi-polar surfaces 241 and 243. The m-axis (the (1-100) direction) that defines the non-polar planes is substantially parallel to the surface 202 of the silicon substrate. During the GaN crystal growth, the electrically polar surface 242 (shown in FIG. 4B) parallel to the m-axis is formed at the growth front. The surface 241 is at an angle of approximately 62° relative to the (111) surface 202 of the silicon substrate. The GaN growth rate is higher along the c-axis (i.e., in the (0001) direction) than along the m-axis (the (1-100) direction). The GaN growth rate is in turn higher along the m-axis (the (1-100) direction) than along the (1-101) direction.

Figure 5A:
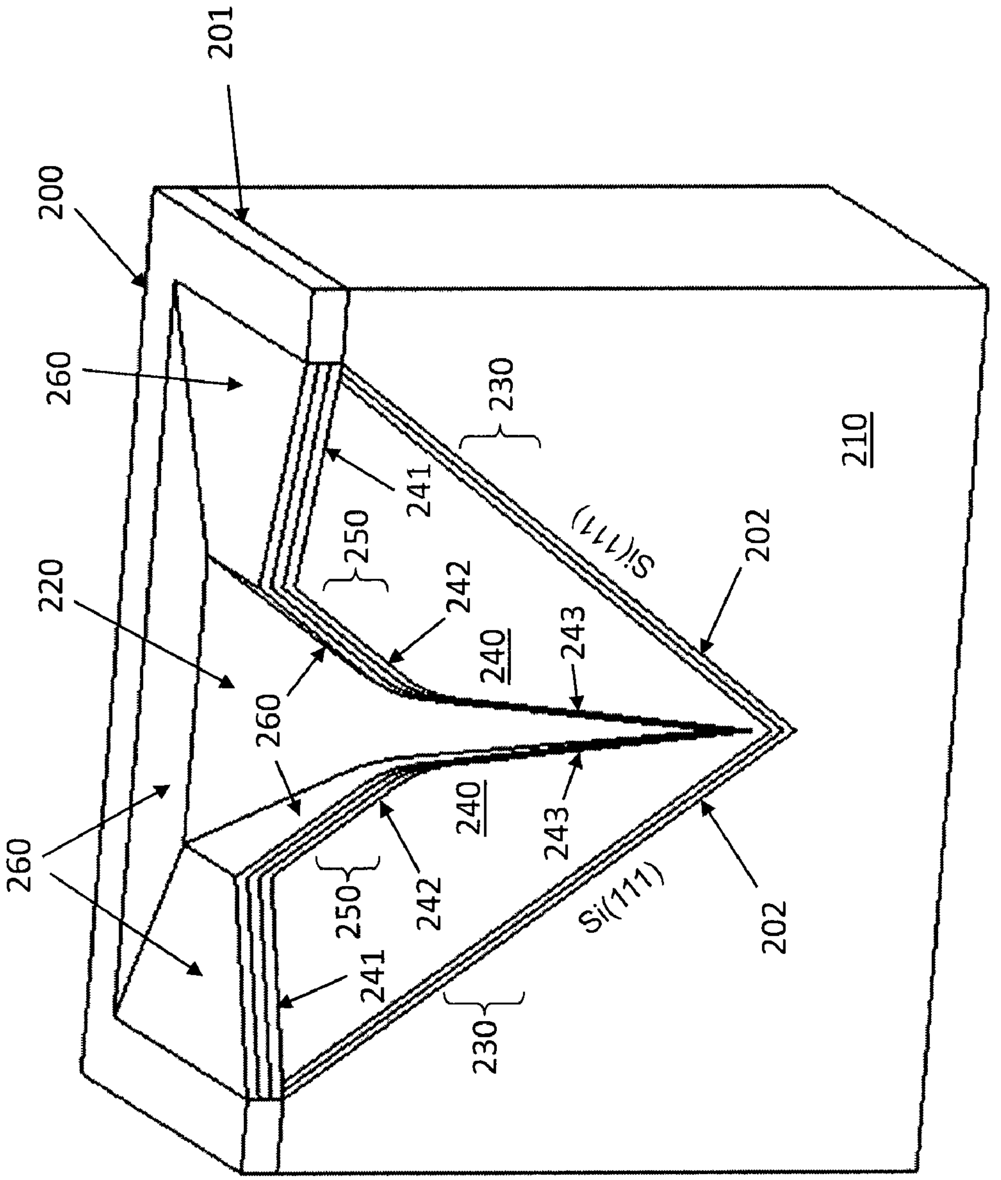
FIG. 5A is a perspective cross-sectional view of the light emitting device shown in FIGS. 2, 3A and 4B.
Figure 5B:
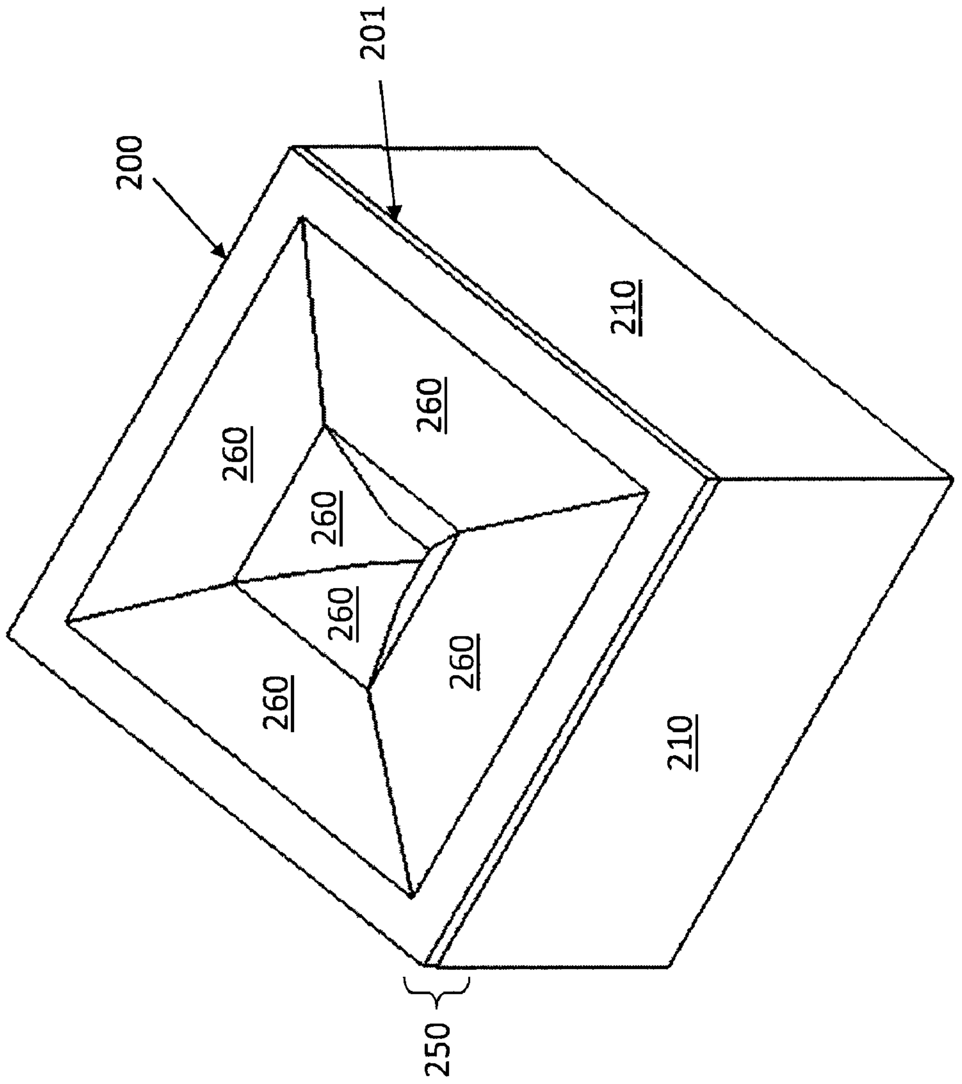
FIG. 5B is a perspective view of the light emitting device shown in FIG. 5A.
Figure 6A:
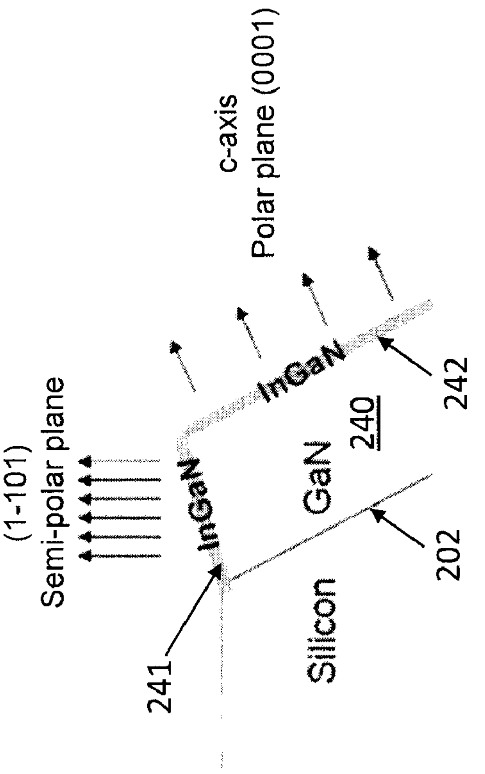
FIG. 6A illustrates the light emission directions from the semi-polar and the polar GaN crystal surfaces.
Figure 6B:
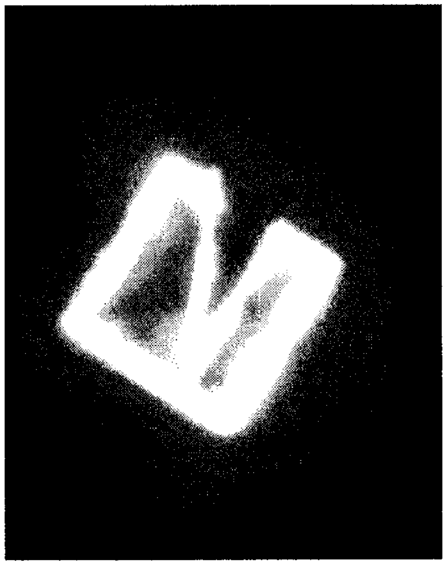
FIG. 6B is a photograph of the light emitting device of FIGS. 2, 3A and 5A during light emission.

Details of the light emitting device 200 are shown in perspective views in FIGS. 5A and 5B. Referring both to FIGS. 2, 5B, 6A, and 6B, the recess 220 has the shape of an inverse pyramid. FIG. 6A illustrates the light emission directions from a semi-polar surface 241 and a polar GaN crystal surface 242. FIG. 6B is a photograph of a light emitting device as described above during light emission. The center of the light emitting device is partially blocked by the tip of an electrode that is pressed in contact with the upper electrode to provide the voltage across the quantum well layers. The light emissions from the quantum well layers on the semi-polar surfaces (241) are much stronger than those from the quantum well layers on the polar surfaces (242), and the light emissions from quantum well layers in the direction of the non-polar plane, shown by the arrow in FIG. 2, are the strongest of all. It should be noted that in the disclosed light emitting device, the recess and the growth of the GaN structure are arranged such as to allow the semi-polar surface 241 of the GaN structure to be exposed to the outside in the direction of primary light emission in order to maximize the light emission from the stronger light emission surfaces. Accordingly, a significant advantage of the disclosed light emitting device is to provide much increased light emission intensity by forming light emission layers on semi-polar surfaces of a doped GaN structure.

Figure 7:
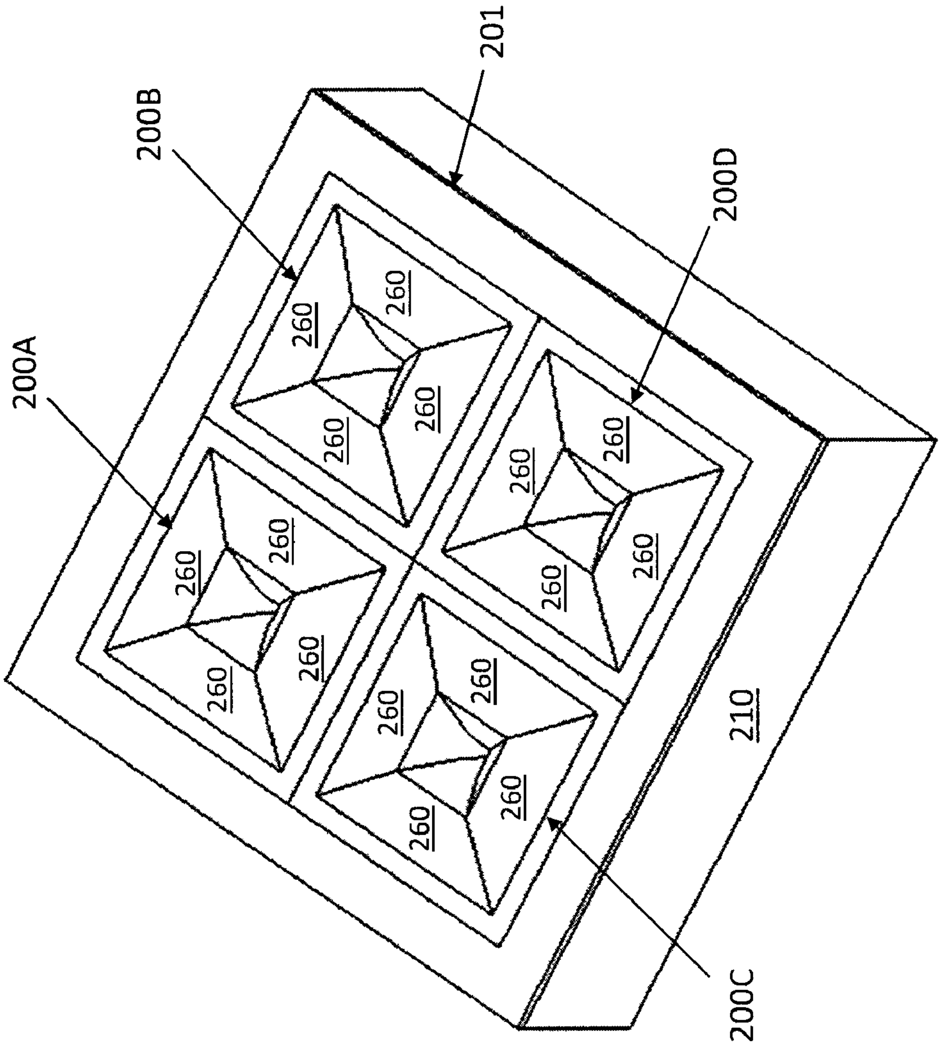
FIG. 7 is a perspective view of an array of light emitting devices similar to the ones shown in FIGS. 5A and 5B, formed on a common substrate.

An array of light emitting device s 200A-200D can be formed on a common substrate 210, as shown in FIG. 7. Each of these light emitting devices 200A-200D has a similar structure to the one shown in FIGS. 2-5B. The array can have different numbers of light emitting structures, as shown in FIGS. 2-5B, to suit the needs of different lighting and display applications, for example, 2×1, 2×2, 3×2, 3×3, 4×4, etc.

Figure 8:
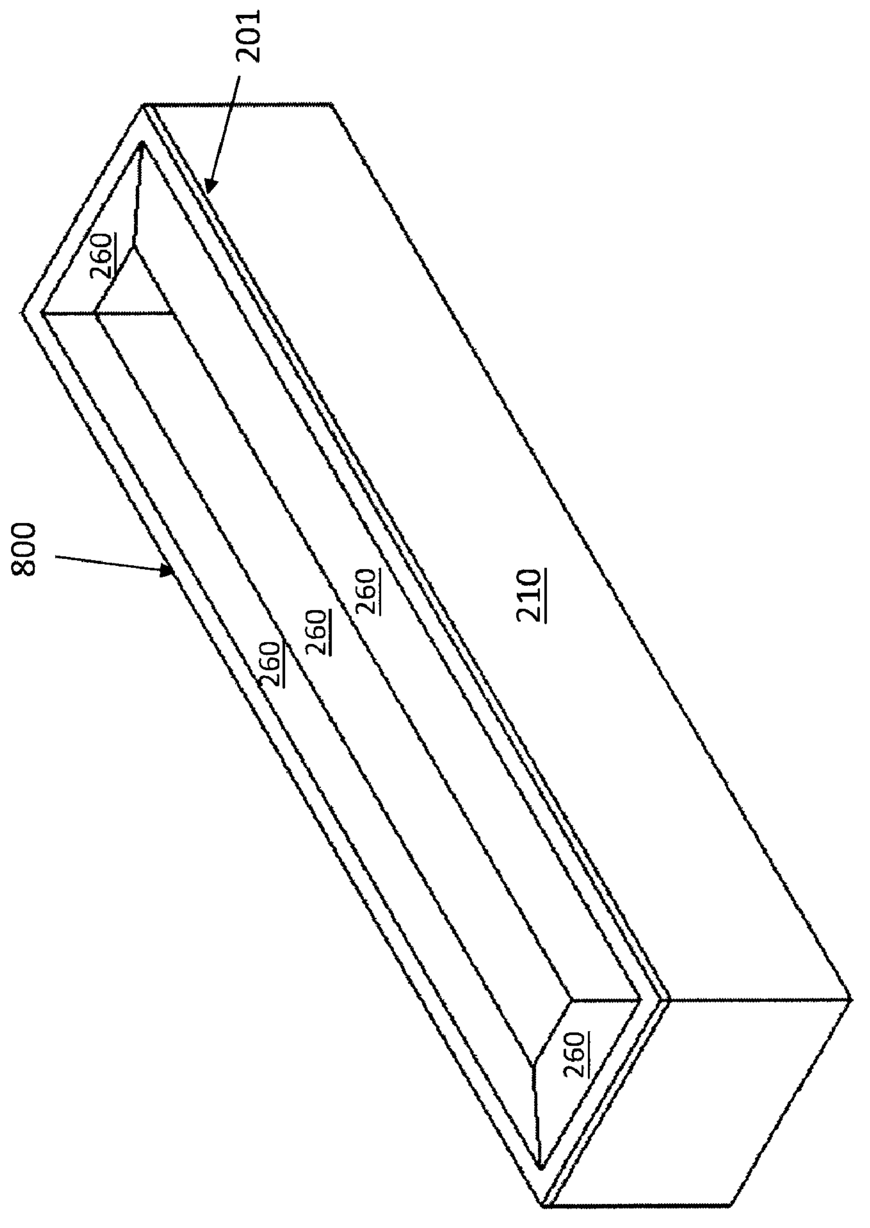
FIG. 8 is a perspective view of a light emitting device having a different form factor from the light emitting device shown in FIG. 7.
Figure 9:
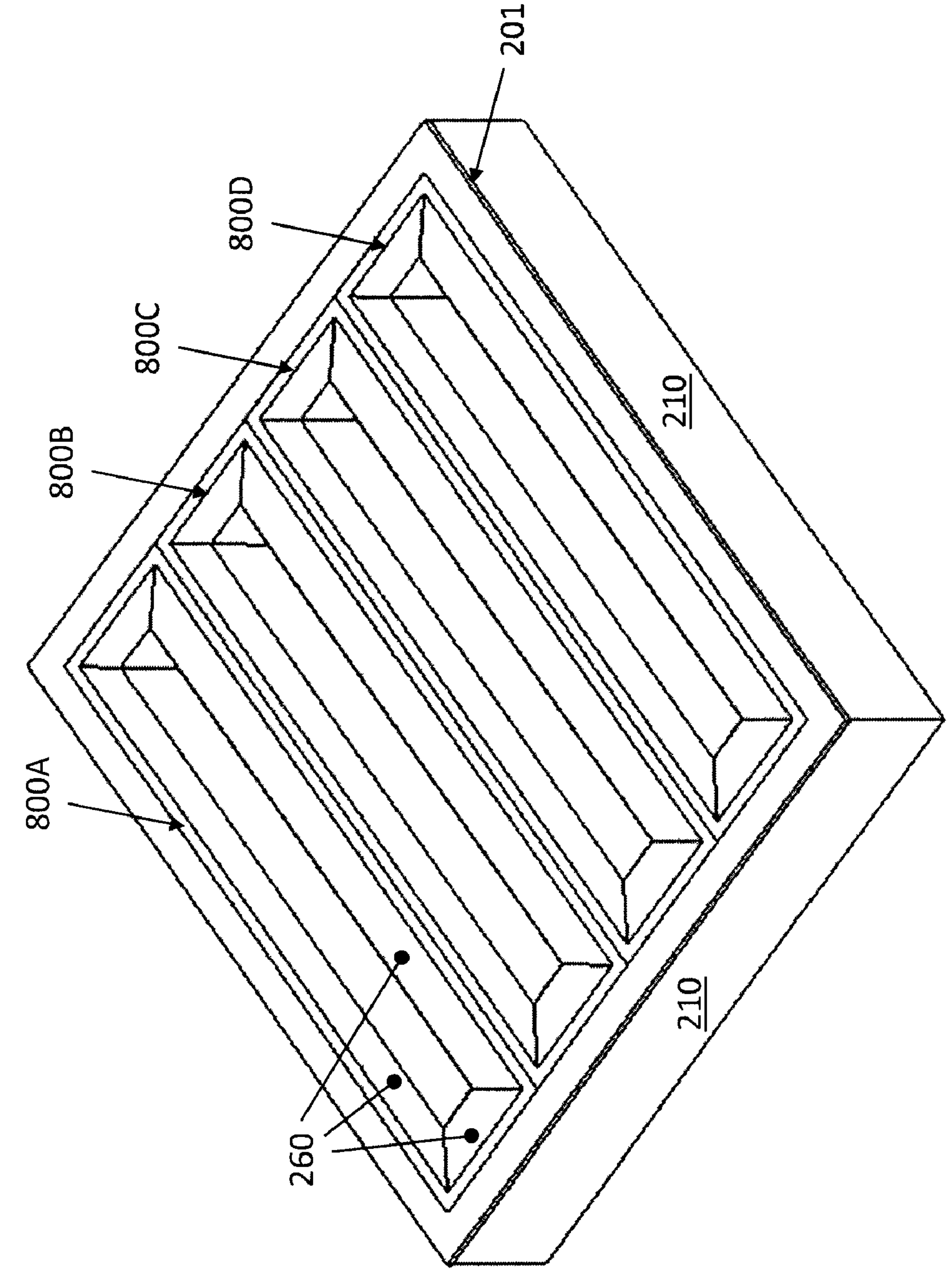
FIG. 9 is a perspective view of an array of light emitting devices similar to the one shown in FIG. 8, formed on a common substrate.

The light emitting devices can be made in different shapes and form factors. The recesses in the silicon substrate can have the shapes of an inverse pyramid or a truncated inverse pyramid to provide a substantially square light emitting device. The recesses in the silicon substrate can have the shape of an elongated trench to provide a linear shaped light emitting device. A light emitting device 800, shown in FIG. 8, can have a linear shaped light emission area out of the upper electrode layer 260. An elongated trench is first formed in the substrate 210, followed by the formations of the buffer layers, the reflective layer, the doped GaN structure, the quantum well layers and the upper electrode layer, using the same steps as described above in relation to the light emitting devices 200A-200D. Furthermore, a plurality of linear shaped light emitting devices 800A-800D can be formed on a common substrate 210, as shown in FIG. 9.

The presently disclosed light emitting devices can have one or more of the following advantages. First, light emission efficiency and light emission intensity can be significantly increased in comparison with conventional GaN LED devices by using semi-polar GaN crystal surfaces as a base for the quantum wells. The light emission from the disclosed light emitting device is also highly polarized, which is very useful for many display applications. Another advantage of the present light emitting device is to reduce defect density in the GaN crystals, which improves device reliability and lifetime. Additionally, the disclosed light emitting devices can be tailored in different form factors to suit different applications. Furthermore, the disclosed light emitting devices can be fabricated on a silicon substrate, which is more compatible with the fabrication of many microelectronic devices.

The foregoing description and drawings should be considered as illustrative only of the principles of the invention. The described devices may be configured in a variety of shapes and sizes and the scope of the invention is not limited by the dimensions of the preferred embodiments. Numerous applications of the present invention will readily occur to those skilled in the art. Therefore, the invention is not intended to be limited to the specific examples disclosed or the exact construction, operation or dimensions shown and described. Rather, all suitable modifications and equivalents fall within the scope of the invention. For example, one of the GaN crystal structure and the doped GaN layer 260 can be n-doped and the other p-doped. The types of doping in the two components can be switched while still compatible with the presently disclosed light emitting device. The disclosed LED structure may be suitable for emitting green, blue, and other colored lights. Moreover, the recesses can have other shapes than the examples described above. For example, the openings in the mask on the upper surface may have shapes different from squares or rectangles. In another example, a (111) silicon wafer can be used as a substrate to allow trenches having (100) surfaces to form in the substrate.

What is claimed is:

1. A light emitting device, comprising:

a silicon substrate having a (111) surface;

a GaN crystal structure over the (111) surface of the silicon substrate, the GaN crystal structure having a semi-polar plane, a polar plane and an m-axis, and a first surface along the semi-polar plane and a second surface along the polar plane, wherein the first surface forms an angle between about 52 degrees and about 72 degrees relative to the m-axis; and light emission layers over the first surface, the light emission layers having at least one quantum well comprising GaN.

2. A light emitting device, comprising:

a silicon substrate having a (111) surface;

a GaN crystal structure over the (111) surface of the silicon substrate, the GaN crystal structure having a semi-polar plane and a polar plane, and a first surface along the semi-polar plane and a second surface along the polar plane; and light emission layers over the first surface, the light emission layers having at least one quantum well comprising GaN, wherein the GaN crystal structure has a (1-101) crystal plane, and the first surface is substantially parallel to the (1-101) crystal plane.

3. A light emitting device, comprising:
a silicon substrate having a (111) surface;
a GaN crystal structure over the (111) surface of the silicon substrate, the GaN crystal structure having a semi-polar plane and a polar plane, and a first surface along the semi-polar plane and a second surface along the polar plane; and
light emission layers over the first surface, the light emission layers having at least one quantum well comprising GaN, wherein the first surface intercepts the (111) surface of the silicon substrate at an angle between about 52 degrees and about 72 degrees.

4. A light emitting device, comprising:
a silicon substrate having a (111) surface;
a GaN crystal structure over the (111) surface of the silicon substrate, the GaN crystal structure having a semi-polar plane and a polar plane, and a first surface along the semi-polar plane and a second surface along the polar plane; and
light emission layers over the first surface, the light emission layers having at least one quantum well comprising GaN, wherein the first surface and the second surface intercept each other at an angle between about 108 degrees and about 128 degrees.

5. A light emitting device, comprising:
a silicon substrate having a (111) surface;
a GaN crystal structure over the (111) surface of the silicon substrate, the GaN crystal structure having a semi-polar plane and a polar plane, and a first surface along the semi-polar plane and a second surface along the polar plane;
light emission layers over the first surface, the light emission layers having at least one quantum well comprising GaN; and
a reflective layer between the (111) surface of the silicon substrate and the GaN crystal structure, the reflective layer comprising silicon doped AlGaN or silicon doped AlN.

6. A light emitting device, comprising:
a silicon substrate having a (111) surface;
a GaN crystal structure over the (111) surface of the silicon substrate, the GaN crystal structure having a semi-polar plane and a polar plane, and a first surface along the semi-polar plane and a second surface along the polar plane;
light emission layers over the first surface, the light emission layers having at least one quantum well comprising GaN;
a reflective layer between the (111) surface of the silicon substrate and the GaN crystal structure; and
a buffer layer between the reflective layer and the (111) surface of the silicon substrate, the buffer layer comprising silicon doped AlN.

7. A light emitting device, comprising:
a silicon substrate having a (111) surface;
a GaN crystal structure over the (111) surface of the silicon substrate, the GaN crystal structure having a semi-polar plane and a polar plane, and a first surface along the semi-polar plane and a second surface along the polar plane; and
light emission layers over the first surface, the light emission layers having at least one quantum well comprising GaN,
wherein the silicon substrate further comprises:
a (100) upper surface; and
a recess, in part defined by the (111) surface of the silicon substrate, formed in the (100) upper surface.

8. The light emitting device of claim 7, wherein the recess has the shape of a trench, an inverse pyramid, or a truncated inverse pyramid.

9. A light emitting device, comprising:
a silicon substrate having a (100) upper surface, the (100) upper surface having a recess, the recess being defined in part by (111) surfaces of the silicon substrate;
a GaN crystal structure over one of the (111) surfaces, the GaN crystal structure having a semi-polar plane and a polar plane, and a first surface along the semi-polar plane and a second surface along the polar plane; and
light emission layers over the first surface, the light emission layers having at least one quantum well comprising GaN.

10. The light emitting device of claim 9, wherein the recess has the shape of a trench, an inverse pyramid, or a truncated inverse pyramid.

11. The light emitting device of claim 9, wherein the GaN crystal structure has an m-axis, and the first surface forms an angle between about 52 degrees and about 72 degrees relative to the m-axis.

12. The light emitting device of claim 9, wherein GaN crystal structure has a (1-101) crystal plane and the first surface is substantially parallel to the (1-101) crystal plane.

13. The light emitting device of claim 9, wherein the first surface intercepts a (111) surface of the silicon substrate at an angle between about 52 degrees and about 72 degrees.

14. The light emitting device of claim 9, wherein the GaN crystal structure has a (0001) crystal plane and a c-axis, and the second surface is substantially parallel to the (0001) crystal plane and perpendicular to the c-axis.

15. The light emitting device of claim 9, wherein the first and the second surfaces of the GaN crystal structure intercept each other at an angle between about 108 degrees and about 128 degrees.

16. The light emitting device of claim 9, wherein the GaN crystal structure is doped and is electrically conductive, the light emitting device further comprising:
an upper electrode layer on the light emission layers, wherein the light emission layers are configured to emit light when an electric field is applied across the light emission layers between the GaN crystal structure and the upper electrode layer.

17. The light emitting device of claim 9, further comprising a reflective layer between the GaN crystal structure and one of the (111) surfaces of the silicon substrate.

18. The light emitting device of claim 17, further comprising a buffer layer between the reflective layer and the one of the (111) surfaces of the silicon substrate.

* * * * *